(12) United States Patent
de Jong et al.

(10) Patent No.: US 11,482,974 B2
(45) Date of Patent: Oct. 25, 2022

(54) RADIO-FREQUENCY AMPLIFIER

(71) Applicant: NXP B.V., San Jose, CA (US)

(72) Inventors: Gerben Willem de Jong, Veldhoven (NL); Mark Pieter van der Heijden, Eindhoven (NL); Jozef Reinerus Maria Bergervoet, Eindhoven (NL)

(73) Assignee: NXP B.V., Eindhoven (NL)

( * ) Notice: Subject to any disclaimer, the term of this patent is extended or adjusted under 35 U.S.C. 154(b) by 45 days.

(21) Appl. No.: 17/027,782

(22) Filed: Sep. 22, 2020

(65) Prior Publication Data

US 2021/0126597 A1    Apr. 29, 2021

(30) Foreign Application Priority Data

Oct. 23, 2019   (EP) ..................................... 19204812

(51) Int. Cl.
*H03F 3/24*     (2006.01)
*H03F 1/56*     (2006.01)
*H03F 3/195*    (2006.01)

(52) U.S. Cl.
CPC ............. *H03F 3/245* (2013.01); *H03F 1/565* (2013.01); *H03F 3/195* (2013.01); *H03F 2200/315* (2013.01); *H03F 2200/451* (2013.01); *H03F 2200/541* (2013.01)

(58) Field of Classification Search
CPC ...................................................... H03F 3/245
See application file for complete search history.

(56) References Cited

U.S. PATENT DOCUMENTS

| 6,356,149 | B1  | 3/2002  | Stengel et al. |         |
|-----------|-----|---------|----------------|---------|
| 9,209,754 | B2* | 12/2015 | Embar          | H03F 1/0288 |
| 2005/0280466 | A1* | 12/2005 | Gailus | H03F 3/602 |
|           |     |         |                | 330/124 R |
| 2006/0164163 | A1 | 7/2006 | Apel et al. | |

(Continued)

FOREIGN PATENT DOCUMENTS

| EP | 2770634 A1    | 8/2014  |
|----|---------------|---------|
| KR | 20050120077 A | 12/2005 |
| WO | 2013133215 A1 | 9/2013  |

OTHER PUBLICATIONS

Cho, Y., "A Dual Power-Mode Multi-Band Power Amplifier With Envelope Tracking for Handset Applications", IEEE Transactions on Microwave Theory and Techniques, vol. 61, No. 4, Apr. 2013.

(Continued)

*Primary Examiner* — Patricia T Nguyen (57) ABSTRACT

An RF power amplifier is described including a first amplifier and a second amplifier arranged in parallel between an RF power amplifier input and an RF power amplifier output. A phase adjuster adjusts the phase of a signal on at least one of the first amplifier signal path and the second amplifier signal path. A first impedance inverter has a first impedance inverter input coupled to an output of the second amplifier and a first impedance inverter output coupled to the RF power amplifier output. The RF power amplifier is configured to enable at least one of the first amplifier and the second amplifier dependent on an operation mode and the first impedance inverter is configured to modulate the load impedance of the second amplifier in response to the operation mode changing.

14 Claims, 6 Drawing Sheets

(56) References Cited

U.S. PATENT DOCUMENTS

| | | | | |
|---|---|---|---|---|
| 2010/0315162 | A1* | 12/2010 | Gajadharsing | H03F 1/08 |
| | | | | 330/124 R |
| 2012/0294387 | A1* | 11/2012 | Ghannouchi | H03F 1/0288 |
| | | | | 375/295 |
| 2014/0128158 | A1 | 5/2014 | Munakata et al. | |
| 2015/0116039 | A1* | 4/2015 | Ahmed | H03F 3/211 |
| | | | | 330/295 |
| 2015/0145602 | A1* | 5/2015 | Felgentreff | H03F 1/56 |
| | | | | 330/295 |
| 2016/0006399 | A1* | 1/2016 | Blednov | H03F 3/193 |
| | | | | 330/295 |
| 2018/0006611 | A1* | 1/2018 | de Jong | H03F 1/30 |
| 2018/0034419 | A1* | 2/2018 | Moronval | H03F 1/565 |

OTHER PUBLICATIONS

Choi, H., "A Triple-Power-Mode Digital Polar CMOS RF Power Amplifier With LO Duty Cycle Control", IEEE Microwave and Wireless Components Letters, vol. 26, No. 9, Sep. 2016.

Kim, S., "CDMA Handset Power Amplifier with a Switched Output Matching Circuit for Low/High Power Mode Operations", 2004 IEEE MTT-S International Microwave Symposium Digest, Jun. 6-11, 2004.

\* cited by examiner

RADIO-FREQUENCY AMPLIFIER

CROSS-REFERENCE TO RELATED APPLICATIONS

This application claims the priority under 35 U.S.C. § 119 of European Patent application no. 19204812.2, filed on 23 Oct. 2019, the contents of which are incorporated by reference herein.

FIELD

This disclosure relates to a radio-frequency (RF) amplifier for a transmitter.

BACKGROUND

RF transmitters for example used in wireless local-area network (WLAN) or for cellular communication typically have a power amplifier which has several power/gain modes, depending on the distance to bridge. This is normally implemented by a number of power amplifier stages arranged in parallel which can be selectively switched on or off.

SUMMARY

Various aspects of the disclosure are defined in the accompanying claims.

In a first aspect there is provided an RF power amplifier comprising: a first amplifier and a second amplifier arranged in parallel between an RF power amplifier input and an RF power amplifier output; a phase adjuster configured to adjust the phase of a signal on at least one of the first amplifier signal path and the second amplifier signal path; a first impedance inverter having a first impedance inverter input coupled to an output of the second amplifier and a first impedance inverter output coupled to the RF power amplifier output; and wherein the RF power amplifier is configured to enable at least one of the first amplifier and the second amplifier dependent on an operation mode and the first impedance inverter is configured to modulate the load impedance of the second amplifier in response to the operation mode changing.

In one or more embodiments, the phase adjuster may comprise a phase splitter having a phase splitter input coupled to the RF power amplifier input and a phase splitter output coupled to an input of each of the first amplifier and the second amplifier.

In one or more embodiments, the RF power amplifier may further comprise a third amplifier arranged in parallel with the first and second amplifiers; wherein the phase splitter output is coupled to the third amplifier input wherein dependent on the operation mode the RF power amplifier is further configured to enable the third amplifier.

In one or more embodiments, the first impedance inverter input may be coupled to the third amplifier output wherein the first impedance inverter is further configured to modulate the load impedance of the third amplifier in response to the operation mode changing.

In one or more embodiments, the RF power amplifier may further comprise a second impedance inverter arranged between the third amplifier output and the first impedance inverter input wherein the first and second impedance inverters are configured to modulate the load impedance of the second and third amplifier in response to the operation mode changing.

In one or more embodiments, the RF power amplifier may further comprise a second impedance inverter arranged between the third amplifier output and the RF amplifier output wherein the second impedance inverter is configured to modulate the load impedance of the third amplifier in response to the operation mode changing.

In one or more embodiments, the RF power amplifier may further comprise a fourth amplifier arranged in parallel with the first, second, and third amplifiers; wherein the phase splitter output is coupled to the fourth amplifier input and wherein dependent on the operation mode the RF power amplifier is further configured to enable the fourth amplifier.

In one or more embodiments, the first impedance inverter input may be coupled to the fourth amplifier output and wherein the first impedance inverter is further configured to modulate the load impedance of the fourth amplifier in response to the operation mode changing.

In one or more embodiments, the RF power amplifier may further comprise a third impedance inverter arranged between the fourth amplifier output and the second impedance inverter input wherein the second and third impedance inverters are further configured to modulate the load impedance of the fourth amplifier in response to the operation mode changing.

In one or more embodiments, the RF power amplifier may further comprise a transformer arranged between the first amplifier output and the RF power amplifier output.

In one or more embodiments, the transformer may comprise an auto-transformer.

The impedance inverters may comprise one of a quarter-wavelength transmission line, a CLC pi-network, an LCL pi-network, a CLC T-network, and an LCL T-network.

In one or more embodiments, each impedance inverter may have an impedance. $Z_i$, a characteristic impedance $Z_o$ and wherein for a load impedance $Z_L$, the relationship between $Z_i$, $Z_o$ and $Z_L$ is given by $$Zi = \frac{Zo^2}{Z_L}.$$

In one or more embodiments, the RF power amplifier may further comprise a driver arranged between the RF power amplifier input and the phase adjuster Embodiments of the RF power amplifier may be included in an integrated circuit.

Embodiments of the RF power amplifier may be included in an RF transmitter or transceiver for example for a WLAN router or Cellular base station.

BRIEF DESCRIPTION OF THE DRAWINGS

In the figures and description like reference numerals refer to like features. Embodiments of are now described in detail, by way of example only, illustrated by the accompanying drawings in which.

DETAILED DESCRIPTION

Figure 1:
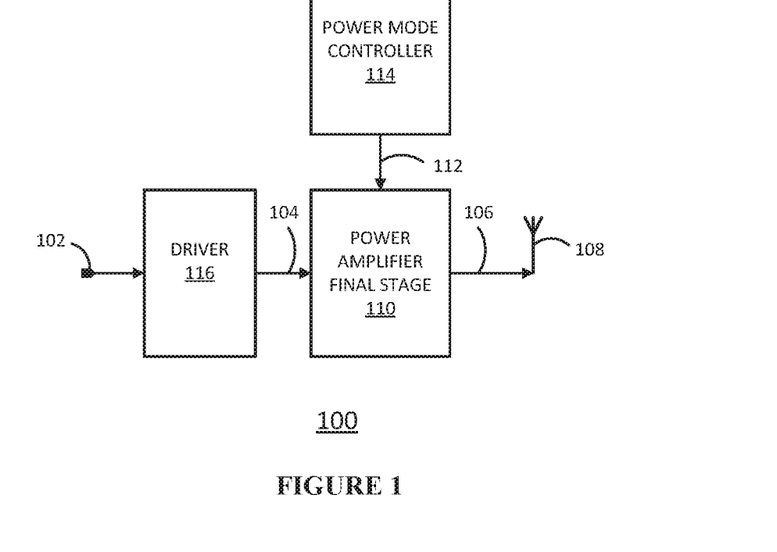
FIG. 1 shows a typical RF transmitter including an RF power amplifier.

FIG. 1 shows a typical RF transmitter 100 which includes a driver 116 or RF amplifier, a power mode controller 114 and a power amplifier final stage 110. The driver 116 has an RF input 102 which is connected to other circuitry in the transmitter (not shown). The driver 116 has an output connected to a final stage RF input 104. The power amplifier output 106 may be connected to an antenna 108. The power amplifier 110 may have a control input 112 connected to an output of a power mode controller 114.

Figure 2:
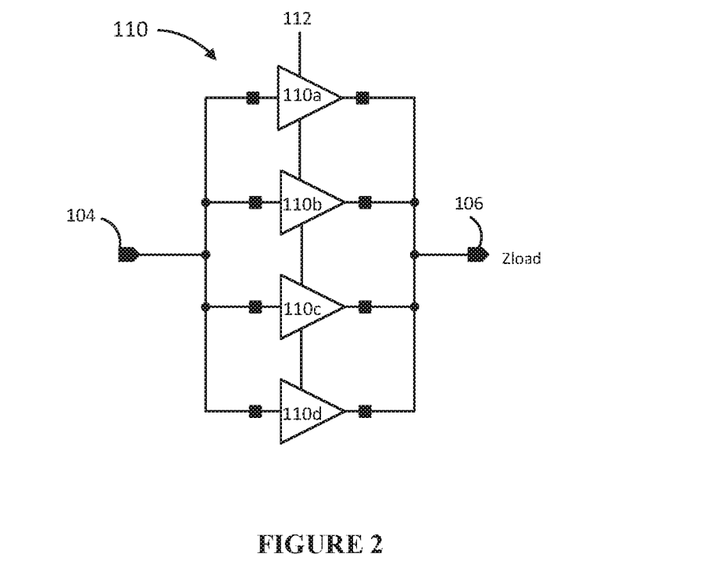
FIG. 2 illustrates a typical RF power amplifier.

A typical known arrangement of the power amplifier final stage 110 is shown in FIG. 2. The power amplifier final stage 110 includes four power amplifier circuits 110a, 110b, 110c, 110d arranged in parallel between the power amplifier input 104 and the power amplifier output 106.

These power amplifier circuits 110a-d may be implemented with bipolar transistors. Each power amplifier circuit 110a-d may be enabled or disabled by the controller 114 via the control input 112. When one of the power amplifier circuits 110a-d is disabled the output of the respective power amplifier circuit 110a-d is high-impedance. When one of the power amplifier circuits 110a-d is enabled then the output of the respective power amplifier circuit 110a-d has a designed output impedance value which may be for example 28 Ohms but could be other values. In this disclosure the examples illustrated have two or three power modes but in other examples there may be four or more power modes.

In a high-power mode all power amplifier circuits 110a-d are enabled or active. In a medium-power mode only two of the power amplifier circuit 110a-d are enabled, for example power amplifier circuits 110c and 110d and the other two are switched off or disabled for example power amplifier circuits 110a and 110b. In a low-power mode only one of the power amplifier circuits 110a-d is active, for example power amplifier circuit 110d and the other three are switched off for example power amplifier circuits 110a-c.

To obtain high efficiency each of the power amplifier circuits should see an optimal load impedance which is determined by the design of the amplifier circuits. For example an optimal load impedance for each of the power amplifier circuits may be 28 Ohms at the desired frequency such as for example 5 GHz. As an example, if the load at the power amplifier output ($Z_{Load}$) is 7 Ohms then when all power amplifier circuits 110a-d are enabled in the high power mode, because they are arranged in parallel, each of the power amplifier circuits 110a-d will see the optimal load impedance of 28 Ohms. However in the medium power mode, the two enabled power amplifier circuits 110c-d will only see a load impedance of 14 Ohms each since the two disabled power amplifier circuits 110a-b are high impedance. In the low power mode, the power amplifier circuit 110d will only see a load impedance of 7 Ohms. Consequently in the medium and low power modes the power amplifier 110 will operate at lower efficiency.

Figure 3:
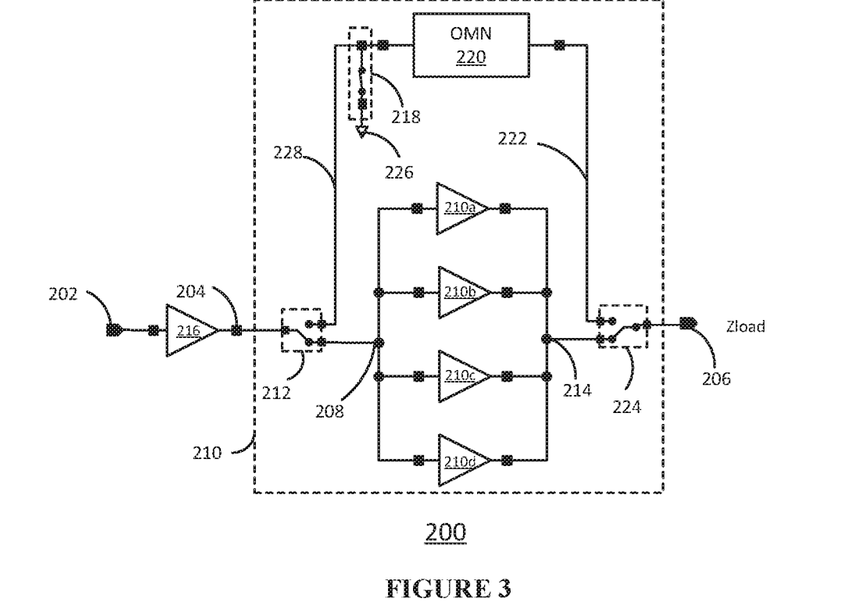
FIG. 3 shows a typical RF power amplifier.

FIG. 3 shows a typical RF power amplifier 200 which includes a driver 216 which is an RF amplifier, and a power amplifier final stage 210. The driver 216 has an RF input 202 which is connected to other circuitry in the transmitter (not shown). The driver 216 has an output connected to a power amplifier final stage RF input 204. The power amplifier output 206 may be connected to an antenna (not shown). The power amplifier final stage 210 may have a control input (not shown) connected to an output of a power mode controller (not shown).

The power amplifier final stage 210 includes four power amplifier circuits 210a, 210b, 210c, 210d arranged in parallel between a first node 208 and a second node 214. The first node 208 is connected to a first terminal of a first switch 212 which may be implemented as a transistor. The second node 214 is connected to a first terminal of a second switch 224 which may be implemented as a transistor The power amplifier final stage input 204 is connected to a second terminal of the first switch 212. A third node 228 is connected to a third terminal of the first switch 212, a first terminal of shunt switch 218, which may be implemented as a transistor, and an input of output matching network (OMN) 220. A ground 226 is connected to a second terminal of the shunt switch 218.

A fourth node 222 may be connected to an output of the OMN 220 and a second terminal of the second switch 224. The power amplifier output 206 may be connected to a third terminal of the second switch 224.

Each power amplifier circuit 210a-d may be enabled or disabled by a controller connected to a respective enable input (not shown). The first switch 212, the second switch 224 and the shunt switch each have a control input (not shown) connected to the controller (not shown).

In operation, the power amplifier circuits 210a-d may be enabled and disabled dependent on the power modes in a similar way to transmitter 100.

In a high-power mode all power amplifier circuits 210a-d are enabled or active. In a medium-power mode only two of the power amplifier circuits 210a-d are enabled, for example power amplifier circuits 210c and 210d and the other two are switched off or disabled for example power amplifier circuits 210a and 210b.

FIG. 3 illustrates the position of the switches 212,224,218 in high and medium power modes. The first switch 212 is configured to connect the power amplifier input 204 to the first node 208. The second switch 224 is configured to connect the power amplifier output 206 to the second node 214. The shunt switch 218 is closed and connects the input of the OMN 220 to ground 226 to prevent a parasitic feedback path from the second node 214 to the first node 208.

For RF transmitter 200, in a low-power mode the first switch 212 is configured to connect the output of the driver 216 to the input of the OMN 220. The second switch 224 is configured to connect the power amplifier output 206 to the output of the OMN 220. The shunt switch 218 is open circuit and disconnects the input of the OMN 220 from ground 226. By using the driver 216 and the OMN 220 in low power mode which bypasses the power amplifier circuits 210a-d completely, the efficiency in low power modes may be improved. However the use of switches in the signal path to switch between the different power modes reduces the efficiency and bandwidth of the power amplifier due to insertion losses and parasitic capacitance of the switches in the signal path in all 3 power modes.

Figure 4A:
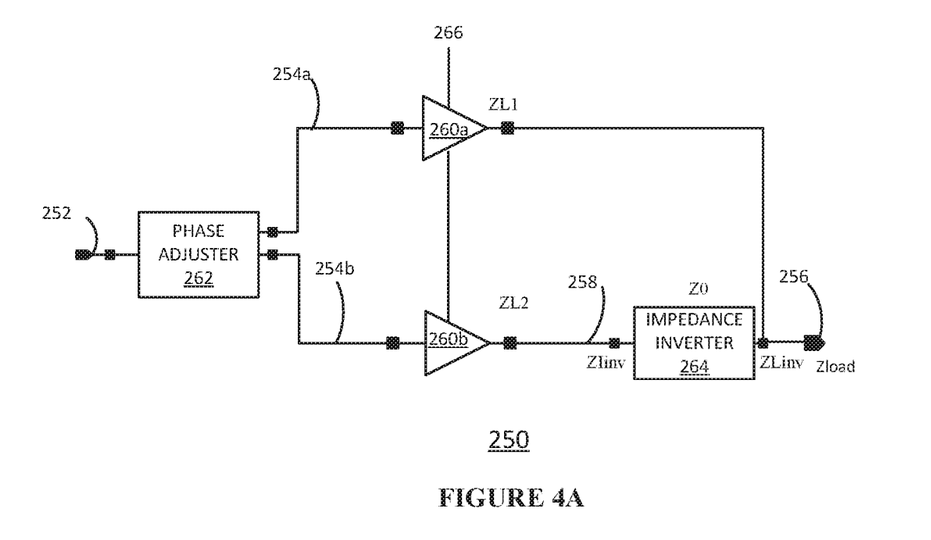
FIG. 4A illustrates an RF power amplifier stage for a WLAN or cellular transmitter according to an example embodiment.

FIG. 4A shows an RF power amplifier 250 according to an example embodiment. The power amplifier 250 includes a phase adjuster 262, two power amplifier circuits 260a, 260b and an impedance inverter 264.

An RF power amplifier input 252 may be connected to an input of the phase adjuster 262.

A first node 254a may connect a first output of the phase adjuster 262 to an input of the first power amplifier circuit 260a.

A second node 254b may connect a second output of the phase adjuster 262 to an input of the second power amplifier circuit 260b.

A second amplifier output 258 may be connected to an input of the impedance inverter 264.

RF amplifier output 256 may be connected to an output of the first power amplifier circuit 260a and an output of the impedance inverter 264. The power amplifier circuits 260a-b may have control inputs 266 to enable or disable each circuit. An impedance-inverter has a relationship between the characteristic impedance, $Z_0$, the input impedance, $Z_{in}$ and load impedance. $Z_L$ defined by the relationship $$Z_{in} = \frac{Zo^2}{Z_L}.$$

An impedance inverter can be implemented in different ways, for example by a quarter-wavelength transmission line, a CLC pi-network, an LCL pi-network, a CLC T-network, or an LCL T-network. Some of these implementations will introduce 90 degrees phase lagging, while others will introduce 90 degrees phase leading.

The impedance-inverter 264 and the phase adjuster 262 actively modulate the load during power-mode switching. The phase adjuster 262 at the input compensates for the 90-degrees phase shift (either positive or negative) introduced by the impedance inverter 264 at the output, such that the signals of the two branches i.e. the output of the first power amplifier circuit 260a and the output of the impedance inverter 264 add constructively. A phase adjuster or phase shifter may be implemented in a number of different ways, for example using an all-pass filter, a vector modulator, and a transmission line. An all-pass filter has poles and zeros in the Laplace plane arranged symmetrically around the imaginary axis. A vector modulator may contain a poly-phase filter and two multipliers. An impedance inverter as described in this disclosure may also implement a phase shifter.

The phase adjuster 262 may adjust the phase of the signals on the first amplifier signal path i.e. the path from the RF input 252 via the first amplifier circuit 260a to the RF output 256 and the second amplifier signal path i.e. the path from the RF input 252 via the second amplifier circuit 260b to the RF output 256.

The load impedances seen by each of the power amplifier circuits 260a-b for an output load $Z_{load}$ of 7 Ohms and a characteristic impedance Zo for the impedance inverter 264 of 14 Ohms are indicated in table 1 for the following power modes. In the high power mode all the power amplifier circuits 260a-b may be enabled. In the low power mode the power amplifier circuit 260b may be enabled and the power amplifier circuit 260a may be disabled. The load impedance seen by each of the power amplifier circuits 260a-b is denoted as ZL1 to ZL2 respectively. The input impedance of the impedance inverter is denoted ZIinv and the load impedance seen by the impedance inverter is denoted as ZLinv.

TABLE 1

| Impedance Value [Ohms]/Power Mode ($Z_{load}$ = 7 Ω) | Low power | High power |
|---|---|---|
| ZIinv (Zo = 14 Ω) | 28 | 14 |
| ZLinv (Zo = 14 Ω) | 7 | 14 |
| ZL1 | — | 14 |
| ZL2 | 28 | 14 |

In the high-power mode all power amplifier circuits 260a-b are loaded with 14 Ohms each, which is considered to be optimal in this example. In the low-power mode the load impedance for the single section still being active increases to 28 Ohms, which results in higher efficiency for 6-dB lower power levels.

It should be noted that each of the power amplifier circuits presents a high output impedance when it is switched off. The inventors of the present disclosure have appreciated that the power amplifier 250 may be used to modulate the impedance in different power modes to provide a more efficient power amplifier compared to previous solutions, as the load impedance is more optimal for the different power modes. The power amplifier 250 does not require switches in the signal path which would introduce insertion losses.

Figure 4B:
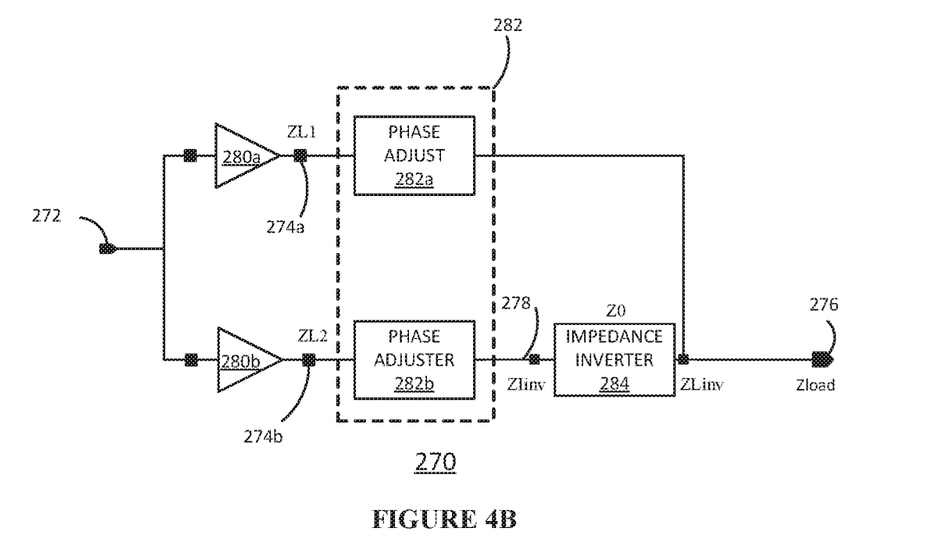
FIG. 4B illustrates an RF power amplifier stage for a WLAN or cellular transmitter according to an example embodiment.

FIG. 4B shows an RF power amplifier 270 according to an example embodiment. The power amplifier 270 includes a phase adjuster 282, two power amplifier circuits 280a, 280b and an impedance inverter 284. The phase adjuster 282 includes a first phase adjust circuit 282a and second phase adjuster 282b.

An RF power amplifier input 272 may be connected to an input of each of the first power amplifier circuit 280a and the second power amplifier circuit 280b.

A first node 274a may connect an input of the first phase adjuster circuit 282a to an output of the first power amplifier circuit 280a.

A second node 274b may connect an input of the second phase adjuster circuit 282b to an output of the second power amplifier circuit 280b.

The output 278 of the second phase adjuster 282b may be connected to an input of the impedance inverter 284.

RF amplifier output 276 may be connected to an output of the first phase adjuster circuit 282a and an output of the impedance inverter 284.

The power amplifier circuits 280a-b may have control inputs (not shown) to enable or disable each circuit.

The operation of the RF power amplifier 270 is similar to the power amplifier 250. The phase adjuster 282 adjusts the phase of the signals output from the respective amplifier circuits 280a, 280b so that they add constructively at the output rather than before the input as done for power amplifier 250. As a relative phase shift is required, in some examples either the first phase adjust circuit 282a or the second phase adjust circuit 282b may be omitted. In other respects, the operation of the RF power amplifier 270 is the same as power amplifier 250. In some examples, the impedance inverter 284 may be arranged before the second phase adjuster circuit 282b. In some examples, the phase adjuster circuits 282a and 282b may be combined with the power amplifier circuits 280a, 280b so that the power amplifier circuit adjusts the phase of the respective RF signals.

Figure 5:
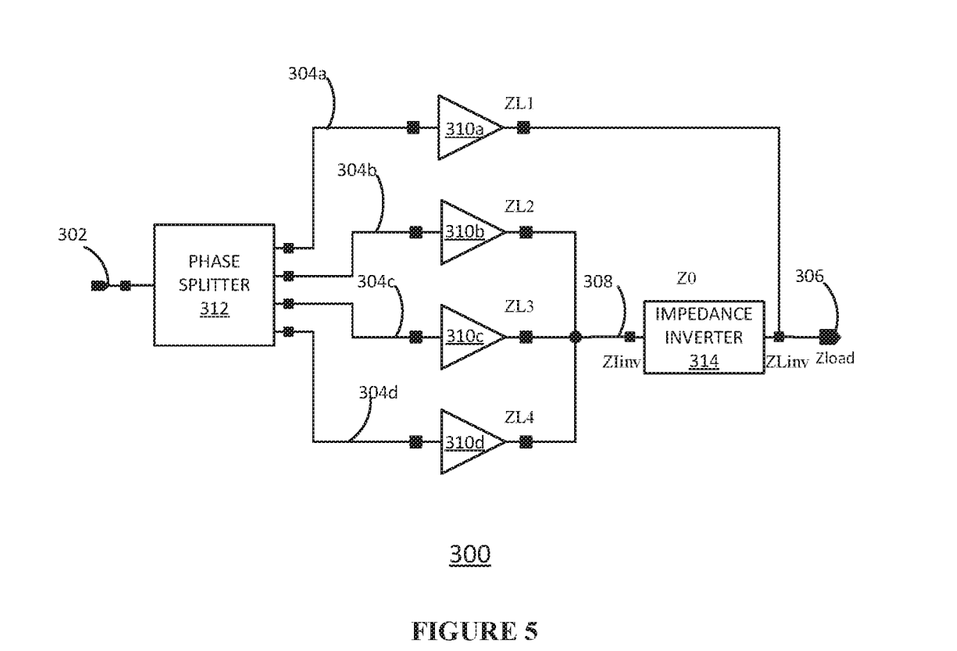
FIG. 5 illustrates an RF power amplifier stage for a WLAN or cellular transmitter according to an example embodiment.

FIG. 5 shows an RF power amplifier 300 according to an example embodiment. The power amplifier 300 includes a phase splitter 312, four power amplifier circuits 310a, 310b, 310c, 310d and an impedance inverter 314.

An RF power amplifier input 302 may be connected to an input of the phase splitter 312.

A first node 304a may connect a first output of the phase splitter 312 to an input of the first power amplifier circuit 310a.

A second node 304b may connect a second output of the phase splitter 312 to an input of the second power amplifier circuit 310b.

A third node 304c may connect a third output of the phase splitter 312 to an input of the third power amplifier circuit 310c.

A fourth node 304d may connect a fourth output of the phase splitter 312 to an input of the fourth power amplifier circuit 310d.

A common output node 308 may be connected to an input of the impedance inverter 314. The common output node 308 may be connected to an output of each of the power amplifier circuits 310b, 310c and 310d.

RF amplifier output 306 may be connected to an output of the first power amplifier circuit 310a and the output of the impedance inverter 314.

The four power amplifier circuits 310a-d may have control inputs (not shown) to enable or disable each circuit dependent on the power mode of operation. A controller (not shown) may determine the power mode by controlling the power amplifier circuits.

The impedance-inverter 314 at the common output node 308 of power amplifier circuits 310b-d and the phase splitter at the input of the power amplifier circuits 310a-d result in active load modulation during power-mode switching. The phase splitter 312 at the input adjusts the phase of the signals through the power amplifier circuits 310b-d to compensate for the 90-degrees phase shift (either positive or negative) introduced by the impedance inverter 314 at the output, such that the signals of the two branches i.e. the output of the first power amplifier circuit 310a and the output of the impedance inverter 314 add constructively.

The load impedances seen by each of the four power amplifier circuits 310a-d for an output load $Z_{load}$ of 7 Ohms and a characteristic impedance Zo for the impedance inverter 314 of 9.3 Ohms are indicated in table 2 for the following power modes. In the high power mode all the power amplifier circuits 310a-d may be enabled. In the medium power mode the power amplifier circuits 310c-d may be enabled and the power amplifier circuits 310a-b may be disabled. In the low power mode the power amplifier circuit 310d may be enabled and the power amplifier circuits 310a-c may be disabled. The load impedance seen by each of the power amplifier circuits 310a-d is denoted as ZL1 to ZL4 respectively. The input impedance of the impedance inverter is denoted ZIinv and the load impedance seen by the impedance inverter is denoted as ZLinv.

TABLE 2

| Impedance Value/Power Mode ($Z_{load}$ = 7 Ω) | Low power | Medium Power | High Power |
|---|---|---|---|
| ZIinv (Zo = 9.3 Ω) | 12.4 | 12.4 | 9.3 |
| ZLinv (Zo = 9.3 Ω) | 7 | 7 | 9.3 |
| ZL1 | — | — | 28 |
| ZL2 | — | — | 28 |
| ZL3 | — | 24.9 | 28 |
| ZL4 | 12.4 | 24.9 | 28 |

In the high-power mode all power amplifier circuits 310a-d are loaded with 28 Ohms, which is considered to be optimal in this example. In the medium-power mode 2 sections are switched off and the remaining 2 active sections see a load impedance of 24.9 Ohms each, which is still quite close to the optimum value of 28 Ohms and is much better than the original 14 Ohms for the state-of-the-art solution of FIG. 2. In the low-power mode the load impedance for the single section still being active drops to 12.4 Ohms, which is clearly sub-optimal, but which is still much better than the 7-Ohms loading in the state-of-the-art solution of FIG. 2.

It should be noted that each of the power amplifier circuits presents a high output impedance when it is switched off. The inventors of the present disclosure have appreciated that the power amplifier 300 may be used to modulate the impedance in different power modes to provide a more efficient power amplifier compared to previous solutions, as the load impedance is more optimal for the different power modes. The power amplifier 300 does not require switches in the signal path which would introduce insertion losses. The power amplifier 300 as illustrated contains four power amplifier circuits 310a-d. It will be appreciated that in other examples more than four power amplifier circuits may be used. In other examples one or both of the third and fourth power amplifier circuits 310c, 310d may be omitted.

Figure 6:
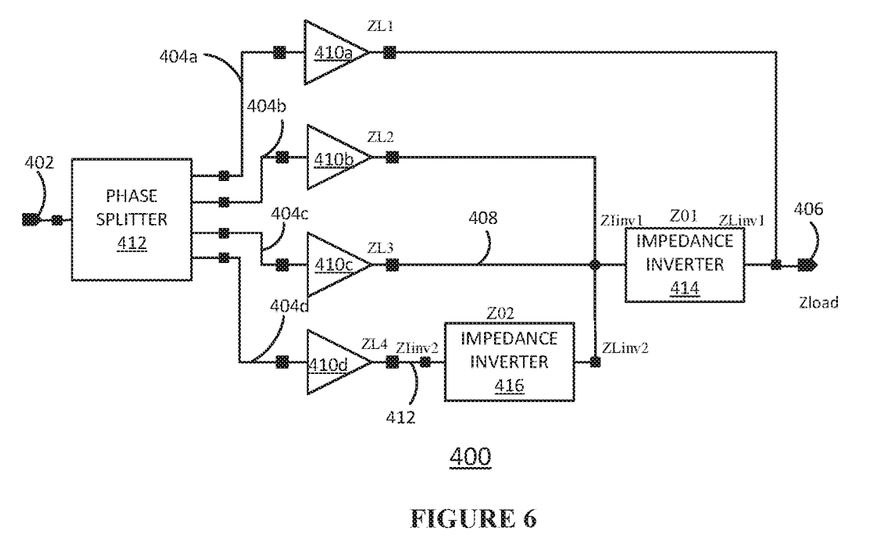
FIG. 6 shows an RF power amplifier stage for a WLAN or cellular transmitter according to an example embodiment.

FIG. 6 shows an RF power amplifier 400 according to an example embodiment. The power amplifier 400 includes a phase splitter 412, four power amplifier circuits 410a, 410b, 410c, 410d, a first impedance inverter 414 and a second impedance inverter 416.

An RF power amplifier input 402 may be connected to an input of the phase splitter 412.

A first node 404a may connect a first output of the phase splitter 412 to an input of the first power amplifier circuit 410a.

A second node 404b may connect a second output of the phase splitter 412 to an input of the second power amplifier circuit 410b.

A third node 404c may connect a third output of the phase splitter 412 to an input of the third power amplifier circuit 410c.

A fourth node 404d may connect a fourth output of the phase splitter 412 to an input of the fourth power amplifier circuit 410d.

A common output node 408 may be connected to an input of the impedance inverter 414. The common output node 408 may be connected to an output of each of the power amplifier circuits 410b, 410c and an output of the second impedance inverter 416. The output of the fourth power amplifier circuit 410d may be connected via node 412 to the input of the second impedance inverter 416.

RF amplifier output 406 may be connected to an output of the first power amplifier circuit 410a and an output of the first impedance inverter 414.

The four power amplifier circuits 410a-d may have control inputs (not shown) to enable or disable each circuit dependent on the power mode of operation. A controller (not shown) may determine the power mode by controlling the power amplifier circuits.

The first impedance-inverter 414, the second impedance inverter 416 and the phase splitter 412 actively modulate the load impedance seen by the active power amplifier circuits during power-mode switching. The phase splitter 412 at the input adjusts the phase of the signal through the four power amplifier circuits 410a-d to compensate for the 90-degrees phase shift (either positive or negative) introduced by the first impedance inverter 414 and the second impedance inverter 416 at the output, such that the signals at the output of the first power amplifier circuit 410a and the output of the first impedance inverter 414 add constructively. The phase splitter 412 is also implemented such that the signals of the outputs of the second power amplifier circuit 410b and the third power amplifier circuit 410c add constructively with the signals at the output of the second impedance inverter 416.

The load impedances seen by each of the 4 power amplifier circuits 410a-d for an output load $Z_{load}$ of 7 Ohms, a characteristic impedance Zo1 for the first impedance inverter 414 of 9.3 Ohms, and a characteristic impedance Zo2 for the second impedance inverter 416 of 28 Ohms are indicated in table 3 for the following power modes. In the high or full power mode all the power amplifier circuits 410a-d may be enabled. In the medium power mode the power amplifier circuits 410c-d may be enabled and the power amplifier circuits 410a-b may be disabled. In the low power mode the power amplifier circuit 410d may be enabled and the power amplifier circuits 410a-c may be disabled. The load impedance seen by each of the power amplifier circuits 410a-d is denoted as ZL1 to ZL4 respectively. The input impedance of the first impedance inverter 414 is denoted ZIinv1 and the load impedance seen by the first impedance inverter is denote as ZLinv1. The input impedance of the second impedance inverter 416 is denoted ZIinv2 and the load impedance seen by the second impedance inverter 416 is denoted as ZLinv2.

TABLE 3

| Impedance Value/Power Mode ($Z_{load}$ = 7 Ω) | Low power | Medium Power | High power |
| --- | --- | --- | --- |
| ZIinv1 (Zo1 = 9.3 Ω) | 12.4 | 12.4 | 9.3 |
| ZLinv1 (Zo1 = 9.3 Ω) | 7 | 7 | 9.3 |
| ZIinv2 (Zo2 = 28 Ω) | 63 | 31.5 | 28 |
| ZLinv2 (Zo2 = 28 Ω) | 12.4 | 24.9 | 28 |
| ZL1 | — | — | 28 |
| ZL2 | — | — | 28 |
| ZL3 | — | 24.9 | 28 |
| ZL4 (=ZIinv2) | 63 | 31.5 | 28 |

In the high-power mode all power amplifier circuits 410a-d are loaded with 28 Ohms, which is considered to be optimal in this example. In the medium-power mode 2 sections are switched off and the remaining 2 active sections see a load impedance of 24.9 Ohms and 31.5 Ohms which is still quite close to the optimum value of 28 Ohms and is much better than the original 14 Ohms for the state-of-the-art solution of FIG. 2. In the low-power mode the load impedance for the single section increases to 63 Ohms which results in much higher efficiency at low power in particular if the maximum output power has to be reduced by factor 9 (9.5 dB).

In general, for a power amplifier circuit, the optimal power value $Po_{MAX}$ is given by $$Po_{MAX} = \frac{[\gamma(V_{supply} - V_{knee})]^2}{2RL_p}$$

where the pre-factor γ depends on the voltage waveform at the collector or drain, which, in turn, depends on the termination of the higher harmonics. $R_{Lp}$ represents the parallel-equivalent resistive part of the load impedance $Z_L$ seen by the collector or drain. $V_{supply}$ is the supply voltage and $V_{knee}$ is the knee voltage. When the maximum output power $Po_{MAX}$ is delivered, then the efficiency is approximately at its peak value. Therefore, the optimal value of $R_{Lp}$, $R_{Lp\_opt}$ is:

$$RL_{p-opt} = \frac{[\gamma(V_{supply} - V_{knee})]^2}{2Po_{MAX}}$$

Consequently, a low $P_{o\_max}$ results in a high $R_{Lp\_opt}$, for example 63 Ohms in this case.

The addition of the second impedance inverter 416 may further improve the low power performance of the power amplifier 400.

Figure 7:
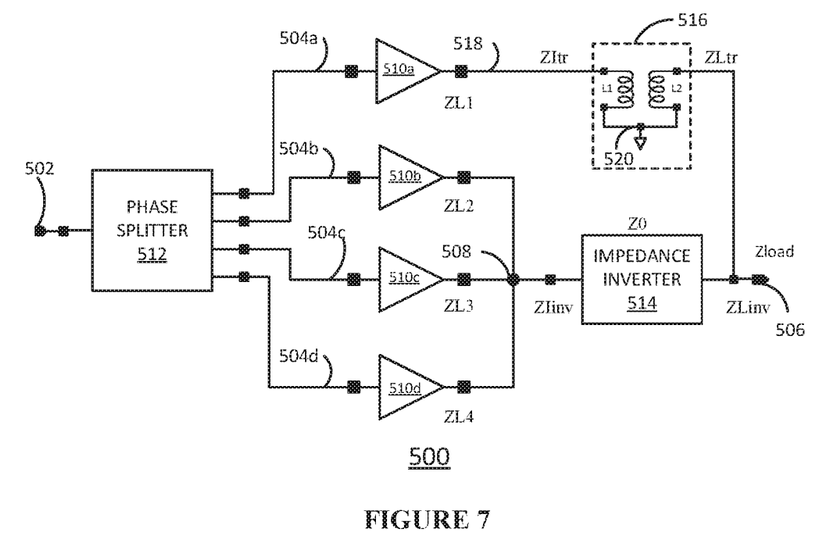
FIG. 7 illustrates an RF power amplifier stage for a WLAN or cellular transmitter according to an example embodiment.

For a typical load impedance of 50 Ohms a further impedance transformation from 7 Ohms to 50 Ohms may be required which may be implemented in the RF power amplifier 500 illustrated in FIG. 7.

The power amplifier 500 includes a phase splitter 512, four power amplifier circuits 510a, 510b, 510c, 510d and an impedance inverter 514 similar to power amplifier 300. In addition, the power amplifier includes an impedance transformer 516

An RF power amplifier input 502 may be connected to an input of the phase splitter 512.

A first node 504a may connect a first output of the phase splitter 512 to an input of the first power amplifier circuit 510a.

A second node 504b may connect a second output of the phase splitter 512 to an input of the second power amplifier circuit 510b.

A third node 504c may connect a third output of the phase splitter 512 to an input of the third power amplifier circuit 510c A fourth node 504d may connect a fourth output of the phase splitter 512 to an input of the fourth power amplifier circuit 510d.

A common output node 508 may be connected to an input of the impedance inverter 514. The common output node 508 may be connected to an output of each of the power amplifier circuits 510b, 510c and 510d.

Node 518 may connect the output of the first power amplifier circuit 510a to the input of the impedance transformer 516.

RF amplifier output 506 may be connected to an output of the impedance transformer 516 and an output of the impedance inverter 514. The impedance transformer 516 may include a primary coil L1 connected between the impedance transformer input and a ground 520. The impedance transformer 516 may include a secondary coil L2 connected between the impedance transformer output and a ground 520. The square of the number of turns ratio of the coils L2/L1 may determine the impedance transformation between input and output.

The four power amplifier circuits 510a-d may have control inputs (not shown) to enable or disable each circuit dependent on the desired mode of operation.

The impedance-inverter 514 at the common output node 508 of power amplifier circuits 510b-d and the phase splitter at the input of the power amplifier circuits 510a-d result in active load modulation during power-mode switching.

The load impedances seen by each of the four power amplifier circuits 510a-d for an output load $Z_{load}$ of 50 Ohms and a characteristic impedance Zo for the impedance inverter 514 of 24.9 Ohms are indicated in table 4 for the following power modes. In the high power mode all the power amplifier circuits 510a-d may be enabled. In the medium power mode the power amplifier circuits 510c-d may be enabled and the power amplifier circuits 510a-b may be disabled. In the low power mode the power amplifier circuit 510d may be enabled and the power amplifier circuits 510a-c may be disabled. The load impedance seen by each of the power amplifier circuits 510a-d is denoted as ZL1 to ZL4 respectively. The input impedance of the impedance inverter is denoted ZIinv and the load impedance seen by the impedance inverter is denote as ZLinv. The load impedance of the impedance transformer 516 is denoted ZLtr and the input impedance is denoted as ZItr. The ratio of turns of the secondary coil L2 to primary coil L1 of the impedance transformer 516 is 2.67:1 in this example embodiment.

TABLE 4

| Impedance Value/Power Mode ($Z_{load}$ = 50 Ω) | Low power | Medium Power | High power |
|---|---|---|---|
| ZIinv (Zo = 24.9 Ω) | 12.4 | 12.4 | 9.3 |
| ZLinv (Zo = 24.9 Ω) | 50 | 50 | 66.7 |
| ZItr | — | — | 28 |
| ZLtr | — | — | 200 |
| ZL1 (=ZItr) | — | — | 28 |
| ZL2 | — | — | 28 |
| ZL3 | — | 24.9 | 28 |
| ZL4 | 12.4 | 24.9 | 28 |

The load impedances in this example are the same as for the RF power amplifier 300. In the high-power mode all power amplifier circuits 510a-d are loaded with 28 Ohms, which is considered to be optimal in this example. In the medium-power mode two sections are switched off and the remaining two active sections see a load impedance of 24.9 Ohms each, which is still quite close to the optimum value of 28 Ohms and is much better than the original 14 Ohms for the state-of-the-art solution of FIG. 2. In the low-power mode the load impedance for the single section still being active drops to 12.4 Ohms. By integrating a transformation from 7 Ohms to 50 Ohms within the circuit, the RF losses may be reduced.

Figure 8:
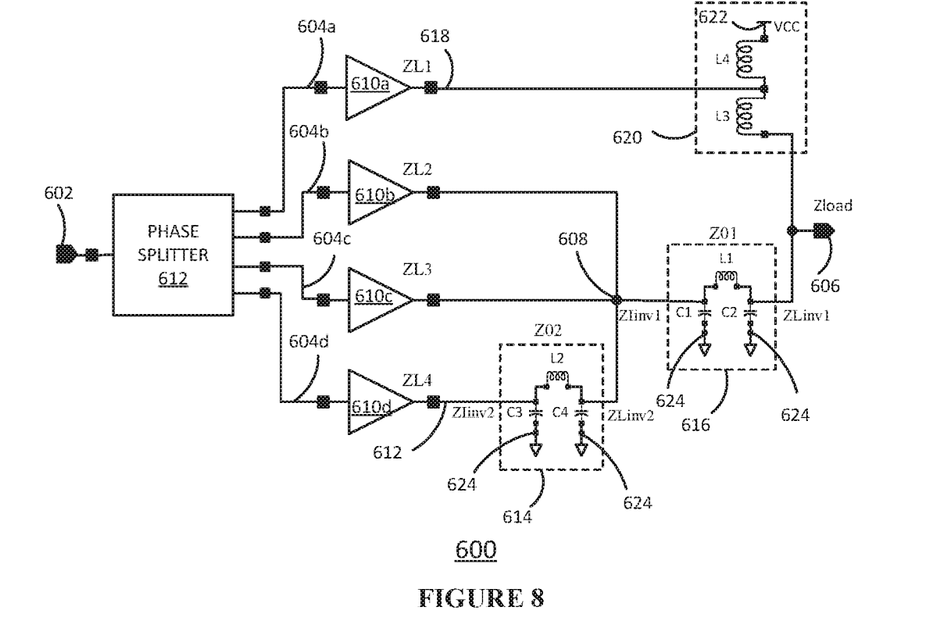
FIG. 8 illustrates an RF power amplifier stage for a WLAN or cellular transmitter according to an example embodiment.

FIG. 8 shows an RF power amplifier 600 according to an example embodiment for driving a 50 Ohms load. The power amplifier 600 is similar to the power amplifier 400 with an additional impedance transformer. The power amplifier 600 includes a phase splitter 612, four power amplifier circuits 610a, 610b. 610c, 610d, a first impedance inverter 616, a second impedance inverter 614.

An RF power amplifier input 602 may be connected to an input of the phase splitter 612.

A first node 604a may connect a first output of the phase splitter 612 to an input of the first power amplifier circuit 610a.

A second node 604b may connect a second output of the phase splitter 612 to an input of the second power amplifier circuit 610b.

A third node 604c may connect a third output of the phase splitter 612 to an input of the third power amplifier circuit 610c.

A fourth node 604d may connect a fourth output of the phase splitter 612 to an input of the fourth power amplifier circuit 610d.

A common output node 608 may be connected to an input of the impedance inverter 616. The common output node 608 may be connected to an output of each of the power amplifier circuits 610b, 610c and an output of the second impedance inverter 614. The output of the fourth power amplifier circuit 610d may be connected via node 612 to the input of the second impedance inverter 614.

The first impedance inverter 616 is implemented as a CLC pi-network with an inductor L1 connected between the impedance inverter input and the impedance inverter output. A capacitor C1 is connected between the impedance inverter input and a ground 624. A capacitor C2 is connected between the impedance inverter output and a ground 624. The second impedance inverter 614 is implemented as a CLC pi-network with an inductor L2 connected between the impedance inverter input and the impedance inverter output. A capacitor C3 is connected between the impedance inverter input and a ground 624. A capacitor C4 is connected between the impedance inverter output and a ground 624.

RF amplifier output 606 may be connected to an output of the first impedance inverter 616 and an output of the impedance transformer 620. Impedance transformer 620 is an auto transformer including two inductor coils L4 and L3 arranged in series between a supply node 622 and the impedance transformer output. The impedance transformer input is the common connection between the inductor coils L3 and L4 and is connected to the output 618 of the first power amplifier circuit 610a.

The four power amplifier circuits 610a-d may have control inputs (not shown) to enable or disable each circuit dependent on the power mode of operation. A controller (not shown) may determine the power mode by controlling the power amplifier circuits.

The first impedance-inverter 614, the second impedance inverter 616 and the phase splitter 612 actively modulate the load impedance seen by the active power amplifier circuits during power-mode switching.

The load impedances seen by each of the 4 power amplifier circuits 610a-d for an output load $Z_{load}$ of 50 Ohms, a characteristic impedance Zo1 for the first impedance inverter 616 of 24.9 Ohms, and a characteristic impedance Zo2 for the second impedance inverter 614 of 28 Ohms are indicated in table 5 for the following power modes. In the high or full power mode all the power amplifier circuits 610a-d may be enabled. In the medium power mode the power amplifier circuits 610c-d may be enabled and the power amplifier circuits 610a-b may be disabled. In the low power mode the power amplifier circuit 610d may be enabled and the power amplifier circuits 610a-c may be disabled. The load impedance seen by each of the power amplifier circuits 610a-d is denoted as ZL1 to ZL4 respectively. The input impedance of the first impedance inverter 616 is denoted ZIinv1 and the load impedance seen by the first impedance inverter is denoted as ZLinv1. The input impedance of the second impedance inverter 614 is denoted ZIinv2 and the load impedance seen by the second impedance inverter 614 is denoted as ZLinv2.

TABLE 5

| Impedance Value/Power Mode ($Z_{load}$ = 50 Ω) | Low power | Medium Power | High power |
|---|---|---|---|
| ZItr | — | — | 28 |
| ZLtr | — | — | 200 |
| ZIinv1 (Zo1 = 24.9 Ω) | 12.4 | 12.4 | 9.3 |
| ZLinv1 (Zo1 = 24.9 Ω) | 50 | 50 | 66.7 |
| ZIinv2 (Zo2 = 28 Ω) | 63 | 31.5 | 28 |
| ZLinv2 (Zo2 = 28 Ω) | 12.4 | 24.89 | 28 |
| ZL1 | — | — | 28 |
| ZL2 | — | — | 28 |
| ZL3 | — | 24.89 | 28 |
| ZL4 (=ZIinv2) | 63 | 31.5 | 28 |

The RF power amplifier 600 requires no choke inductors to bias the collectors or drains of the output transistors in each of the power amplifier circuits 610a-d as they can be biased using the autotransformer inductors L3 and L4 and the two impedance inverter inductors L1 and L2. The CLC impedance inverters 614, 616 have a low-pass filter characteristic and therefore may suppress unwanted higher harmonics.

Figure 9:
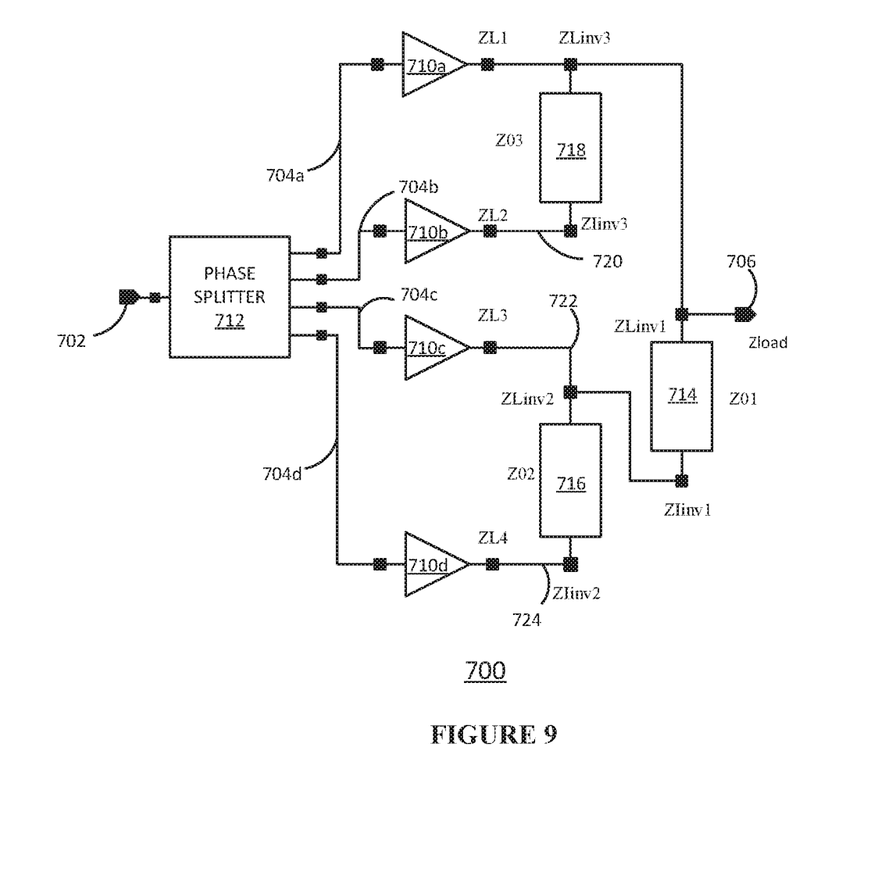
FIG. 9 illustrates an RF power amplifier stage for a WLAN or cellular transmitter according to an example embodiment.

FIG. 9 shows an RF power amplifier 700 which may be used for changing output power in two equal 6-dB steps.

The power amplifier 700 includes a phase splitter 712, four power amplifier circuits 710a, 710b, 710c, 710d, a first impedance inverter 714, a second impedance inverter 716 and a third impedance inverter 718.

An RF power amplifier input 702 may be connected to an input of the phase splitter 712.

A first node 704a may connect a first output of the phase splitter 712 to an input of the first power amplifier circuit 710a.

A second node 704b may connect a second output of the phase splitter 712 to an input of the second power amplifier circuit 710b.

A third node 704c may connect a third output of the phase splitter 712 to an input of the third power amplifier circuit 710c.

A fourth node 704d may connect a fourth output of the phase splitter 712 to an input of the fourth power amplifier circuit 710d.

A first output node 720 may be connected to the output of the second power amplifier circuit 710b.

A second output node 722 may be connected to the output of the third power amplifier circuit 710c, an input of the impedance inverter 714 and an output of the second impedance inverter 716.

A third output node 724 may be connected to the output of the fourth power amplifier circuit 710d and an input of the second impedance inverter 716.

RF amplifier output 706 may be connected to an output of the first power amplifier circuit 710a, an output of the first impedance inverter 714 and an output of the third impedance inverter 718.

The four power amplifier circuits 710a-d may have control inputs (not shown) to enable or disable each circuit dependent on the power mode of operation. A controller (not shown) may determine the power mode by controlling the power amplifier circuits.

Table 6 indicates the load impedances seen by each of the 4 power amplifier circuits 710a-d for an output load $Z_{load}$ of 7 Ohms for three power modes. The first impedance inverter 714 has a characteristic impedance Zo1 of 14 Ohms. The second impedance inverter 716 has a characteristic impedance Zo2 of 28 Ohms. The third impedance inverter 718 has a characteristic impedance Zo3 of 28 Ohms.

In the high or full power mode all the power amplifier circuits 710a-d may be enabled. In the medium power mode the power amplifier circuits 710b and 710d may be enabled and the power amplifier circuits 710a and 710c may be disabled. In the low power mode the power amplifier circuit 710b may be enabled and the power amplifier circuits 710a, 710c and 710d may be disabled.

The load impedance seen by each of the power amplifier circuits 710a-d is denoted as ZL1 to ZL4 respectively. The input impedance of the first impedance inverter 714 is denoted ZIinv1 and the load impedance seen by the first impedance inverter is denote as ZLinv1. The input impedance of the second impedance inverter 716 is denoted ZIinv4-2 and the load impedance seen by the second impedance inverter 716 is denoted as ZLinv2. The input impedance of the third impedance inverter 718 is denoted ZIinv3 and the load impedance seen by the third impedance inverter 718 is denoted as ZLinv3.

TABLE 6

| Impedance Value/Power Mode ($Z_{load}$ = 50 Ω) | Low power | Medium Power | High power |
|---|---|---|---|
| ZIinv1 (Zo1 = 14 Ω) | — | 14 | 14 |
| ZLinv1 (Zo1 = 14 Ω) | — | 14 | 14 |
| ZIinv2 (Zo2 = 28 Ω) | — | 56 | 28 |
| ZLinv2 (Zo2 = 28 Ω) | — | 14 | 28 |
| ZIinv3 (Zo3 = 28 Ω) | 112 | 56 | 28 |
| ZLinv3 (Zo3 = 28 Ω) | 7 | 14 | 28 |
| ZL1 | — | — | 28 |
| ZL2 (=ZIinv3) | 112 | 56 | 28 |
| ZL3 | — | — | 28 |
| ZL4 (=ZIinv2) | — | 56 | 28 |

In the high-power mode all 4 output sections are active. Each section sees a load impedance of 28 Ohms. In the medium-power mode sections 710a and 710c are switched off. Thanks to the impedance inverters, the remaining active sections 710b and 710d see a load impedance of 56 Ohms each (instead of the original 28 Ohms). Since the load impedance has doubled, the maximum output power per section has been halved (−3 dB). Since also the number of active sections has been halved (2 instead of 4), the overall maximum output power has been reduced with a factor of 4 (−6 dB). In the low-power mode only one section, section 710b, is active. In addition, this section 710b sees a load impedance which has doubled again: 112 Ohms instead of 56 Ohms in medium power mode. Therefore, going from medium power to low power, another power step of −6 dB is made.

An RF power amplifier is described including a first amplifier and a second amplifier arranged in parallel between an RF power amplifier input and an RF power amplifier output. A phase adjuster adjusts the phase of a signal on at least one of the first amplifier signal path and the second amplifier signal path. A first impedance inverter has a first impedance inverter input coupled to an output of the second amplifier and a first impedance inverter output coupled to the RF power amplifier output. The RF power amplifier is configured to enable at least one of the first amplifier and the second amplifier dependent on an operation mode and the first impedance inverter is configured to modulate the load impedance of the second amplifier in response to the operation mode changing.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. An RF power amplifier comprising:
a first amplifier disposed in a first amplifier signal path;
a second amplifier disposed in a second amplifier signal path;
a third amplifier disposed in a third amplifier signal path;
a fourth amplifier disposed in a fourth amplifier signal path, wherein each of the first amplifier, the second amplifier, the third amplifier, and the fourth amplifier are arranged between an RF power amplifier input and an RF power amplifier output;
a phase adjuster configured to adjust the phase of a signal on at least one of the first amplifier signal path, the second amplifier signal path, the third amplifier signal path, and the fourth amplifier signal path;
a first impedance inverter having a first impedance inverter input coupled to outputs of the second amplifier, the third amplifier, and the fourth amplifier and having a first impedance inverter output coupled to the RF power amplifier output and an output of the first amplifier; and
a power mode controller configured to selectively enable one or more of the first amplifier, the second amplifier, the third amplifier, and the fourth amplifier, based on a power mode of the RF power amplifier, and wherein the first impedance inverter is configured to modulate a load impedance of the second amplifier in response to a change in the power mode, and
a transformer arranged between the first amplifier output and the RF power amplifier output.

2. The RF power amplifier of claim 1 wherein the phase adjuster comprises a phase splitter having a phase splitter input coupled to the RF power amplifier input and first and second phase splitter outputs respectively coupled to first and second inputs of the first amplifier and the second amplifier.

3. The RF power amplifier of claim 2, wherein the third amplifier is arranged in parallel with the first and second amplifiers, and wherein the phase splitter output is coupled to a third input of the third amplifier.

4. The RF power amplifier of claim 3, wherein the first impedance inverter input is coupled to the output of the third amplifier, and wherein the first impedance inverter is further configured to modulate the load impedance of the third amplifier in response to the change in the power mode.

5. The RF amplifier of claim 3 wherein the fourth amplifier is arranged in parallel with the first, second, and third amplifiers, and wherein at least one of the phase splitter outputs is coupled to a fourth input of the fourth amplifier.

6. The RF power amplifier of claim 5, wherein the first impedance inverter input is coupled to the output of the fourth amplifier, and wherein the first impedance inverter is further configured to modulate the load impedance of the fourth amplifier in response to the change in the power mode.

7. The RF power amplifier of claim 1 wherein the transformer comprises an auto-transformer.

8. The RF power amplifier of claim 1, wherein the first impedance inverter comprises one of: a quarter-wavelength transmission line, a CLC pi-network, an LCL pi-network, a CLC T-network, or an LCL T-network.

9. The RF power amplifier of claim 1, wherein the first impedance inverter has an input impedance $Z_i$, a characteristic impedance $Z_o$ and wherein for a load impedance $Z_L$, the relationship between $Z_i$, $Z_o$ and $Z_L$ is given by $$Zi = \frac{Zo^2}{Z_L}.$$

10. The RF power amplifier of claim 2 comprising a driver arranged between the RF power amplifier input and the phase splitter.

11. An integrated circuit comprising the RF power amplifier of claim 1.

12. A RF transmitter comprising the RF power amplifier of claim 1.

13. An RF power amplifier comprising:
an RF power amplifier input;
an RF power amplifier output;
a phase splitter having an input coupled to the RF power amplifier input and a plurality of outputs;
a first amplifier circuit having a first amplifier circuit input and a first amplifier circuit output, wherein the first amplifier circuit output is coupled to the RF power amplifier output;
a second amplifier circuit having a second amplifier circuit input and a second amplifier circuit output;
a third amplifier circuit having a third amplifier circuit input and a third amplifier circuit output;
a fourth amplifier circuit having a fourth amplifier circuit input and a fourth amplifier circuit output, each of the first amplifier circuit input, the second amplifier circuit input, the third amplifier circuit input, and the fourth amplifier circuit input are coupled to respective outputs of the plurality of outputs of the phase splitter;
a first impedance inverter having a first impedance inverter output coupled to the RF power amplifier output and to the first amplifier circuit output and having a first impedance inverter input coupled to at least one of the second amplifier output, the third amplifier circuit output and the fourth amplifier circuit output; and
a second impedance inverter arranged between the fourth amplifier circuit output and the first impedance inverter input wherein the first impedance inverter is coupled to the second amplifier circuit output and the third amplifier circuit output;
wherein the RF power amplifier is configured to enable at least one of the first, second, third, or fourth amplifier circuits dependent on an operation mode, and the first impedance inverter is configured to modulate at least one load impedance of at least one of the second amplifier circuit, the third amplifier circuit and the fourth amplifier circuit in response to the operation mode changing.

14. An RF power amplifier comprising:
an RF power amplifier input;
an RF power amplifier output;
a phase splitter having an input coupled to the RF power amplifier input and a plurality of outputs;
a first amplifier circuit having a first amplifier circuit input and a first amplifier circuit output, wherein the first amplifier circuit output is coupled to the RF power amplifier output;
a second amplifier circuit having a second amplifier circuit input and a second amplifier circuit output;

a third amplifier circuit having a third amplifier circuit input and a third amplifier circuit output;
a fourth amplifier circuit having a fourth amplifier circuit input and a fourth amplifier circuit output, each of the first amplifier circuit input, the second amplifier circuit input, the third amplifier circuit input, and the fourth amplifier circuit input are coupled to respective outputs of the plurality of outputs of the phase splitter;
a first impedance inverter having a first impedance inverter output coupled to the RF power amplifier output and to the first amplifier circuit output and having a first impedance inverter input coupled to at least one of the second amplifier output, the third amplifier circuit output and the fourth amplifier circuit output;
a second impedance inverter arranged between the fourth amplifier circuit output and the first impedance inverter input wherein the first impedance inverter is coupled to the third amplifier circuit output; and
a third impedance inverter arranged between the second amplifier circuit output and the RF power amplifier output;
wherein the RF power amplifier is configured to enable at least one of the first, second, third, or fourth amplifier circuits dependent on an operation mode, and the first impedance inverter is configured to modulate at least one load impedance of at least one of the second amplifier circuit, the third amplifier circuit and the fourth amplifier circuit in response to the operation mode changing.

\* \* \* \* \*